United States Patent [19]

Shimizu et al.

[11] Patent Number: 4,488,304
[45] Date of Patent: Dec. 11, 1984

[54] STEM FOR SEMICONDUCTOR LASER DEVICES

[75] Inventors: Hirokazu Shimizu, Toyonaka; Kunio Itoh, Uji; Masaru Wada; Takashi Sugino, both of Takatsuki; Takako Okabe, Kusatsu, all of Japan

[73] Assignee: Matsushita Electric Industrial Co., Ltd., Kadoma, Japan

[21] Appl. No.: 583,784

[22] Filed: Feb. 29, 1984

Related U.S. Application Data

[63] Continuation of Ser. No. 299,538, Sep. 4, 1981, abandoned.

Foreign Application Priority Data

Sep. 9, 1980 [JP] Japan .................. 55-124843

[51] Int. Cl.³ .............................................. H01S 3/04
[52] U.S. Cl. .................................. 372/36; 357/81; 372/44
[58] Field of Search ............... 372/36, 44, 34; 357/17, 357/81, 74

[56] References Cited

U.S. PATENT DOCUMENTS

| | | | |
|---|---|---|---|
| 3,840,889 | 10/1974 | O'Brien et al. | 372/36 |
| 4,003,074 | 1/1977 | Yonezu et al. | 372/36 X |
| 4,097,891 | 6/1978 | Selway et al. | 372/36 |
| 4,144,504 | 3/1979 | Leggett et al. | 372/36 |
| 4,338,577 | 7/1982 | Sato et al. | 372/44 X |
| 4,351,005 | 9/1982 | Imai et al. | 357/81 |
| 4,411,057 | 10/1983 | Duda et al. | 372/36 X |

Primary Examiner—James W. Davie
Attorney, Agent, or Firm—Cushman, Darby & Cushman

[57] ABSTRACT

A stem for a semiconductor laser device of a terraced substrate structure which has a tilted active layer against flat parts of the substrate, the stem comprises a base plate and a heat sink block, a flat face of the heat sink block for bonding the semiconductor-laser device thereonto is tilted with respect to a base face of the base plate; this stem has features that the polarization direction of the lased light from the semiconductor laser device can be set to be parallel to (or perpendicular to) the base face of the base plate, and therefore it becomes much easier to make adjustments related with the polarization direction of the lased light.

2 Claims, 5 Drawing Figures

STEM FOR SEMICONDUCTOR LASER DEVICES

This is a continuation of application Ser. No. 299,538, filed Sept. 4, 1981, now abandoned.

BACKGROUND OF THE INVENTION

1. Field of the Invention

This invention relates to a stem for semiconductor laser devices.

2. Description of the Prior Art

Semiconductor laser devices have such advantages that they are compact and highly efficient in energy conversion in comparison with other laser apparatus, and that the lased light from the laser devices can be directly modulated by the driving current. Therefore, they are promising in the use of light sources for optical information data processing. It is required for such application purposes that the semiconductor laser device stably issues lased output of the fundamental transverse mode. Most semiconductor laser devices generally generate substantially linearly polarized light as lased light. And in the cases that they are used as light sources in the application fields related with optical information data processing, it is necessary that the polarization direction is known to the users when mounting in optical apparatus.

In addition, when stems for the semiconductor laser devices are mounted in various optical apparatus, it is necessary to adjust the polarization direction of the linearly polarized light so that the lased light propagates at a specified direction. In this case, it is preferable to employ a stem configuration where the polarization direction of the lased light is set to be parallel to (or perpendicular to) a certain reference face of the stem of the semiconductor laser device. By employing such a configuration it becomes much easier to adjust the polarization direction of the lased light in the optical device.

Recently, various semiconductor laser devices formed on substrates having a novel terraced structure have been proposed in several U.S. patent applications by the same assignee as that of the present invention (e.g. T. SUGINO et al., Ser. No. 40,182 filed on May 18, 1979, now U.S. Pat. No. 4,296,387). It is possible to obtain stable fundamental transverse mode oscillation by such semiconductor laser device where the active layer lies on a plane making a specified angle against the horizontal face of the semiconductor substrate.

FIG. 1 is a cross-sectional view of a semiconductor laser device formed on a substrate 1 having a terraced structure. The semiconductor laser device comprises a substrate 1 of the terraced structure, which has a step 101, clad layers 2 and 4, an active layer 3, a cap layer 5, and electrodes 6 and 7. In general, a polarization direction of the lased light from semiconductor laser devices is parallel to the active layer. This means that the polarization direction (indicated by an arrow "γ") of the semiconductor laser device shown in FIG. 1 makes a specified angle against the horizontal face of the substrate 1. The semiconductor laser device of FIG. 1 has been mounted on a stem shown in FIG. 2.

The stem shown in FIGS. 2(a) and 2(b) is made up of a base plate 8 and a heat sink block 9 on which a semiconductor laser device 10 with a terraced structure is bonded. The heat sink block 9 is soldered to the base plate 8 which is provided with holes 11 for fixing the base plate 8 at an external heat sink.

When the semiconductor laser device 10 of FIG. 1 is mounted on the stem having a bonding face parallel to a stem base line A—A' shown in FIG. 2 (where FIGS. 2(a) and 2(b) are a front view and a side view of a conventional stem for a semiconductor laser device, respectively), the polarization direction indicated by an arrow "γ" becomes tilted against the stem base line A—A'. Accordingly, in case the stem shown in FIGS. 2(a) and 2(b) is mounted in optical apparatus in such a manner that the stem base line A—A' lies parallel to a base face of the optical apparatuses, for example parallel to the horizontal face, then a polarization direction of the lased light becomes tilted from the horizontal face. But, this situation is not appropriate, since it is not easy to adjust mounting positions of optical devices employed in the optical apparatuses by use of a tilted reference line. For example, it is not easy to adjust the optic axes of polarization prisms and wave plates with respect to the polarization direction of the based light.

SUMMARY OF THE INVENTION

The present invention can provide a stem for a semiconductor laser device comprising a heat sink block and a base plate to be fixed to an external heat sink, where a flat face of the heat sink block is tilted against a base face for the horizontal face of the base plate.

DESCRIPTION OF THE PREFERRED EMBODIMENT

The present invention provides a stem for a semiconductor laser device comprising a heat sink block and a base plate to be fixed to an external heat sink, wherein a flat face of the heat sink block is tilted against a base face for specifying the horizontal face of the base plate.

Figure 1:
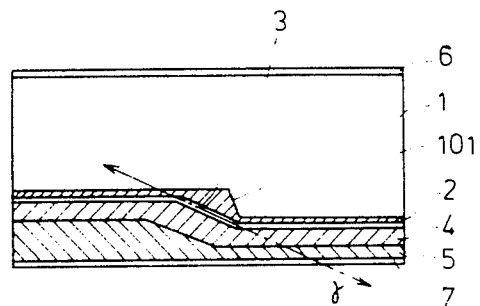
FIG. 1 is a cross-sectional view of a known semiconductor laser device formed on a substrate having a terraced structure.
Figures 2A, 2B:
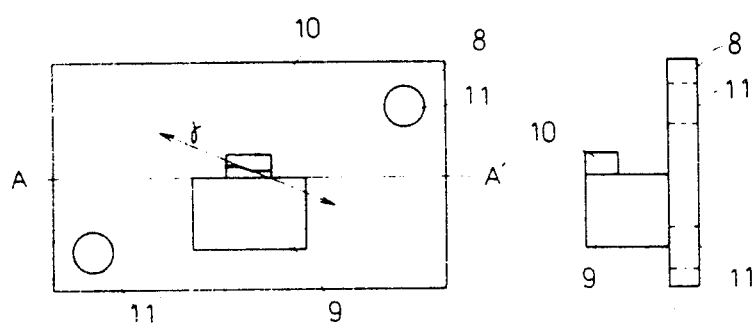
FIGS. 2(a) and 2(b) are a front view and a side view of a conventional stem for a semiconductor laser device, respectively.
Figures 3A, 3B:
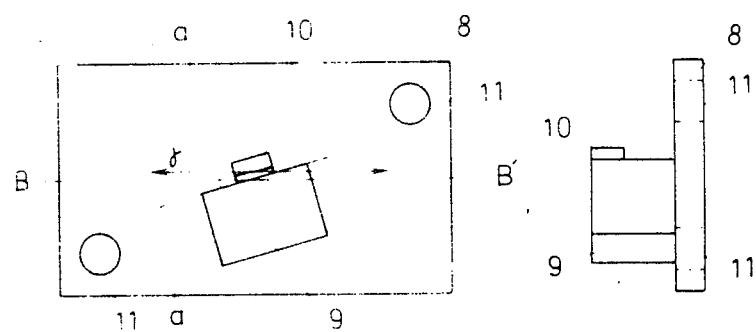
FIGS. 3(a) and 3(b) are a front view and a side view of a stem for a semiconductor laser device embodying the present invention, respectively.

FIGS. 3(a) and 3(b) are a front view and a side view of a stem for a semiconductor laser device embodying the present invention, respectively. The stem shown in FIGS. 3(a) and 3(b) are made up of a base plate 8 and a heat sink block 9 of a rectangular parallelepiped shape. And a semiconductor laser device 10 with a terraced substrate structure is soldered by In to a bonding face of the heat sink block 9. The heat sink block 9 is also soldered to the base plate 8 of a rectangular parallelepiped shape. The heat sink block 9 and the base plate 8 may be heat-conductively connected to each other in any other way. A base line B—B' of the stem shown in FIG. 3(a) is made to coincide with the central line of the base plate 8. In this case, soldering of the heat sink block 9 is made in such a manner that a line indicated at "a" on the bonding face on the heat sink block 9 is tilted by a specified angle against the base line B—B'. This specified angle is selected to be an angle equal to a tilting angle of the active layer against the faces of non-tilted part of the semiconductor substrate of the laser. Consequently, the polarization direction of the lased light (direction indicated by an arrow "γ") becomes parallel to the base line B—B' of the stem. By employing such a configuration, it is easy to accurately adjust the relation between the optic axes of optical devices such as polarizers and wave plates mounted in various optical apparatuses and the reference line that is the base line of the stem. In addition, by modifying the stem configuration it is also possible to set the polarization direction of the lased light to be perpendicular to the base line B—B' of the stem, so that a novel design of the optical apparatus becomes possible.

What is claimed is:

1. A stem for a semiconductor laser device comprising:
   a heat sink block having a flat face for bonding a semiconductor laser device of the type having an active layer oriented at a predetermined angle with respect to a principal face of a substrate of the semiconductor laser device, and
   a base plate to be fixed to an external heat sink, said heat sink block bonded to said base plate at said predetermined angle with respect to a base line of said base plate, such that said base line of said base plate is parallel with the active layer of the semiconductor device.

2. A stem for a semiconductor laser device comprising:
   a heat sink block having a flat face for bonding a semiconductor laser device of the type having an active layer oriented at a predetermined angle with respect to a principal face of a substrate of the semiconductor laser device, and
   a base plate to be fixed to an external heat sink, said heat sink bonded to said base plate at an angle with respect to a base line of said base plate equal to 90° plus said predetermined angle such that said base line of said base plate is perpendicular with the active layer of the semiconductor device.

* * * * *